United States Patent
Lee et al.

(10) Patent No.: US 7,176,537 B2
(45) Date of Patent: Feb. 13, 2007

(54) HIGH PERFORMANCE CMOS WITH METAL-GATE AND SCHOTTKY SOURCE/DRAIN

(75) Inventors: Wen-Chin Lee, Hsin-Chu (TW); Chung-Hu Ke, Taipei (TW); Min-Hwa Chi, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 11/134,897

(22) Filed: May 23, 2005

(65) Prior Publication Data

US 2006/0273409 A1 Dec. 7, 2006

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. .................. 257/407; 257/387; 257/388; 257/412; 257/413; 257/453; 257/454; 257/455; 257/456; 257/471; 257/483; 257/485; 257/486

(58) Field of Classification Search ............... 257/407, 257/453–456, 471, 387–388, 412–413, 483, 257/485, 486

See application file for complete search history.

(56) References Cited

U.S. PATENT DOCUMENTS

| | | | |
|---|---|---|---|
| 6,613,624 B2 * | 9/2003 | Wurzer | 438/200 |
| 6,744,103 B2 | 6/2004 | Snyder | |
| 6,967,379 B2 * | 11/2005 | Matsuo | 257/369 |
| 6,992,358 B2 * | 1/2006 | Hieda et al. | 257/407 |
| 7,112,478 B2 * | 9/2006 | Grupp et al. | 438/197 |
| 2005/0017305 A1 * | 1/2005 | Koyama et al. | 257/351 |
| 2005/0035417 A1 * | 2/2005 | Visokay | 257/407 |
| 2005/0167766 A1 * | 8/2005 | Yagishita | 257/410 |
| 2005/0212055 A1 * | 9/2005 | Nakabayashi et al. | 257/369 |
| 2006/0071285 A1 * | 4/2006 | Datta et al. | 257/407 |

OTHER PUBLICATIONS

Lu, Q., et al., "Dual-Metal Gate Technology for Deep-Submicron CMOS Transistors," 2000 Symposium on VLSI Technology Digest of Technical Papers, Jun. 2000, 2 pages.

(Continued)

*Primary Examiner*—Ida M. Soward
(74) *Attorney, Agent, or Firm*—Slater & Matsil, L.L.P.

(57) ABSTRACT

A semiconductor device having a metal/metal silicide gate and a Schottky source/drain and a method of forming the same are provided. The semiconductor device includes a gate dielectric overlying a semiconductor substrate, a metal or metal silicide gate electrode having a work function of less than about 4.3 eV or greater than about 4.9 eV overlying the gate dielectric, a spacer having a thickness of less than about 100 Å on a side of the gate electrode, and a Schottky source/drain having a work function of less than about 4.3 eV or greater than about 4.9 eV wherein the Schottky source/drain region overlaps the gate electrode. The Schottky source/drain region preferably has a thickness of less than about 300 Å.

15 Claims, 13 Drawing Sheets

OTHER PUBLICATIONS

Chang, L. et al., "Gate Length Scaling and Threshold Voltage Control of Double-Gate MOSFETs," IEDM, Apr. 2000, pp. 719-722.

Rishton, S.A., et al., "New Complimentary Metal-Oxide Semiconductor Technology with Self-Aligned Schottky Source/Drain and Low-Resistance T Gates," J. Vac. Sci. Technol., vol. B 15, No. 6, Nov./Dec. 1997, American Vacuum Society, pp. 2795-2798.

Kedzierski, J., et al., "Metal-Gate FinFET and Fully-Depleted SOI Devices Using Total Gate Silicidation," IEEE, 2002, 4 pages.

Kinoshita, A., et al., "Successful CMOS Operation of Dopant-Segregation Schottky Barrier Transistors (DS-SBTs)," Extended Abstracts of the 2004 International Conference on Solid State Devices and Materials, Tokyo, 2004, pp. 172-173.

* cited by examiner

HIGH PERFORMANCE CMOS WITH METAL-GATE AND SCHOTTKY SOURCE/DRAIN

TECHNICAL FIELD

This invention relates generally to semiconductor devices, specifically to manufacturing processes of MOS devices with Schottky source/drain regions, and more specifically to adjusting work functions of Schottky source/drain regions and gate electrodes of the MOS devices.

BACKGROUND

CMOS has been the basic logic building block in the digital-dominant world for decades. Device dimensions have been continuously reduced in order to achieve higher performance as well as packing density. Gate depletion effects arising from the finite dopant activation in the poly gate have become more and more significant as gate dielectric thickness is scaled below 20 Å. Gate depletion effects induce a voltage drop across the gate depletion region and result in greater effective oxide thickness (EOT) as well as lower current drive. On the other hand, device scaling also necessitates ultra-shallow source/drain extensions with high conductivity in order to simultaneously suppress short-channel effects and source/drain series resistance. However, the targets for source/drain extension in sub-65 nm technologies have become less likely to be met utilizing conventional implant and anneal techniques.

Metal gates have been demonstrated to completely eliminate gate depletion effects and improve device performance. In such an approach, a dual metal scheme in which different metals are used for nMOS devices and pMOS devices is required in order to achieve symmetric and low threshold voltage ($V_{th}$) for both nMOS and pMOS devices. It has been shown that, for ultra-thin body silicon on insulator transistors (SOI) or Fin field effect transistors (FinFET) where $V_{th}$ adjustment is no longer controlled by channel implant, a work function less than about 4.5 eV for nMOS and greater than about 4.9 eV for pMOS must be adopted. However, the process of selective dual metal stacks suffers complicated integration issues such as difficult dual-metal etch requirements, low thermal tolerance, etc. J. Kedzierski, et al. demonstrated a simpler dual-metal gate process on FinFETs, employing total gate silicidation and source/drain silicidation at once. The article is incorporated herein by reference. Various implants prior to gate silicidation are adopted to achieve gate work function in the range of 4.3 eV and 4.8 eV. However, this simple approach is incompatible with bulk technology because the use of a thin dummy poly gate for total gate silicidation is likely to be implanted through during the deep source/drain implantation which is needed for reducing junction leakage and series resistance.

In the quest for ultra-shallow and highly conductive source/drain extension, S. Rishton et al. have demonstrated the feasibility of metal source/drain extensions with differential metal silicide source/drains for nMOS and pMOS, respectively. However, the finite barrier height between the source and channel often presents a strong series resistance effect. Therefore, a low Schottky barrier is necessary for high drive current. ErSi and PtSi have been demonstrated to be best suited for nMOS and pMOS Schottky source/drain regions, respectively, so that a barrier height less than 0.3 eV can be achieved. However, for higher performance, a barrier height less than about 0.2 eV and therefore a metal work function of less than 4.3 eV for nMOS and greater than about 4.9 eV for pMOS is preferred. Hence, novel techniques for work function tuning (other than careful selection of metal materials) are of great importance for optimization of Schottky source/drain region technology.

SUMMARY OF THE INVENTION

A MOS device having a metal/metal silicide gate and a Schottky source/drain and a method of forming the same is provided.

In accordance with a preferred embodiment of the present invention, the MOS device includes a gate dielectric overlying a semiconductor substrate, a gate electrode having a work function of less than about 4.3 eV or greater than about 4.9 eV overlying the gate dielectric, a spacer having a thickness of less than about 100 Å on a side of the gate electrode, and a Schottky source/drain region having a work function less than about 4.3 eV or greater than about 4.9 eV wherein the Schottky source/drain region overlaps the gate electrode. The Schottky source/drain region preferably has a thickness of less than about 300 Å.

In accordance with another preferred embodiment of the present invention, the semiconductor device comprises an nMOS device and a pMOS device. Each of the MOS devices has a spacer with a thickness of less than about 100 Å. The work function of the gate electrode and Schottky source/drain, respectively, of the nMOS device is less than about 4.3 eV, and the work function of the gate electrode and Schottky source/drain, respectively, of the pMOS device is greater than about 4.9 eV. For each device, the Schottky source/drain overlaps the respective gate electrode. The respective Schottky source/drain of the nMOS and pMOS device preferably have a thickness of less than about 300 Å.

In accordance with yet another preferred embodiment of the present invention, a gate dielectric is formed on a semiconductor substrate. A semiconductor dummy gate is formed over the gate dielectric. A spacer preferably having a thickness of less than about 100 Å is formed on a side of the gate electrode. An optional implantation can be performed on the dummy gate and a source/drain region. A metal layer is formed on the dummy gate and the source/drain region wherein the material of the metal layer is selected for its ability to adjust the work function, and a silicidation is performed to fully silicide the dummy gate. A Schottky source/drain is also formed by the silicidation.

In accordance with another preferred embodiment of the present invention, a gate dielectric is formed on a semiconductor substrate. A semiconductor dummy gate is formed over the gate dielectric. A spacer preferably having a thickness of less than about 100 Å is formed on a side of the gate electrode. An optional implantation can be performed on the dummy gate and a source/drain region. A first metal layer is formed over the dummy gate and the source/drain region. The dummy gate is partially silicided and a top silicided portion is formed. A contact etch stop layer (CESL), and then an inter-layer dielectric (ILD) are formed. A chemical mechanical polish is performed to remove at least a portion of the top silicided portion of the dummy gate. A second metal layer is formed over the CESL, ILD and the remaining top silicided portion of the dummy gate. A second silicidation silicides the remaining portion of the dummy gate. By using this embodiment, a device's gate and Schottky source/drain region can have different work functions.

In accordance with yet another preferred embodiment of the present invention, a gate dielectric layer is formed over a substrate. A first metal layer is formed on the gate dielectric layer. The first metal layer may be optionally doped to adjust its work function. The gate dielectric layer and the first metal layer are then patterned to form a gate stack. A spacer is formed. A protective layer is formed over the gate stack. An optional implantation is performed on the exposed substrate. A second metal layer is formed over the previously formed structure. A silicidation is performed to form a Schottky source/drain. The protective layer is then removed. By using this embodiment, a MOS device's gate and Schottky source/drain region can have different work functions.

In accordance with yet other embodiments of the present invention, previously discussed embodiments can be used to form nMOS and pMOS devices in one integrated circuit. The respective gates and Schottky source/drain regions of pMOS devices and nMOS devices can be engineered to have different work functions.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

In the manufacturing of CMOS circuits, a requirement for a well-defined dual metal scheme is that nMOS and pMOS devices have appropriate work functions, respectively, so that symmetrical $V_{th}$ and low-Schottky barriers can be achieved. If the work function of metal silicide material is tunable in a wide range by implants, then the drawback of the use of dual metal materials is eliminated. Thus, the scheme of tuning the work function of silicide can be integrated into CMOS formation allowing the advantages of a silicided gate and Schottky source/drain regions for high performance CMOS devices.

Figure 1:
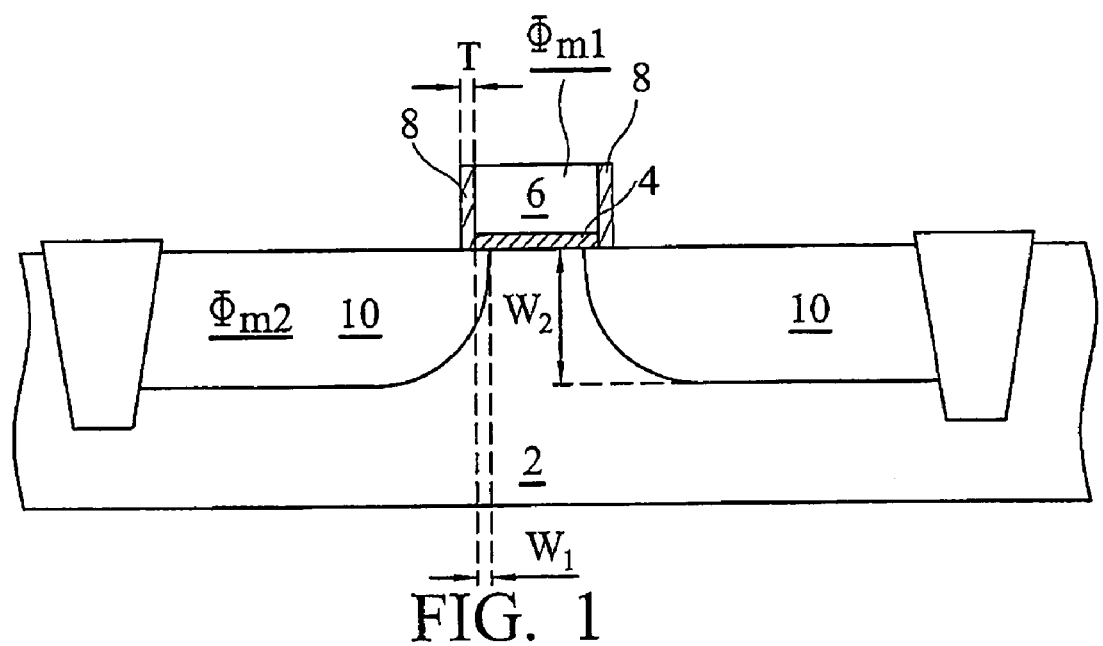
FIG. 1 illustrates a cross sectional view of a preferred embodiment of the present invention, wherein the work functions of the gate and Schottky source/drain of an nMOS device are lower than about 4.3 eV, and the work functions of the gate and Schottky source/drain of a pMOS device are higher than about 4.9 eV.

FIG. 1 illustrates a preferred embodiment of the present invention. A gate dielectric 4 is formed on a substrate 2. The substrate 2 can be a commonly used substrate material such as silicon, SiGe, strained silicon on SiGe, silicon on insulator (SOI), silicon germanium on insulator (SGOI), germanium on insulator (GOI), and the like. Gate dielectric 4 preferably has a high K value. A metal gate 6, preferably comprising metals or metal silicides, is formed on the gate dielectric 4. Spacers 8 preferably have a thickness of less than about 100 Å. Source/drain regions 10 are Schottky source/drain regions formed of metal silicide. With the help of the thin spacers 8, the Schottky source/drain regions 10 are close to the channel. Preferably, the gate electrode 6 and Schottky source/drain regions 10 overlap with a width $W_1$ of greater than 0 Å. The Schottky source/drain regions 10 have a preferred thickness $W_2$ of less than about 300 Å.

The respective work functions of the gate electrode 6 and Schottky source/drain regions 10 are tunable by using different combinations of metal and dopants, and a device may have different work functions for its gate and Schottky source/drain regions. In the preferred embodiment, an nMOS device's gate and Schottky source/drain regions preferably have work functions of less than about 4.3 eV, and a pMOS device's gate and Schottky source/drain regions preferably have work functions of greater than about 4.9 eV. Since the preferred embodiments of the present invention use metal or metal suicides as gates and source/drain regions, no high temperature dopant activation is needed. Therefore, post gate dielectric processes can be performed at lower temperatures, preferably lower than about 550° C. As a result, the formation of an undesired interfacial layer between the gate dielectric 4 and gate electrode 6 or substrate 2 due to high temperature processing is suppressed, leading to better performance.

Figure 2:
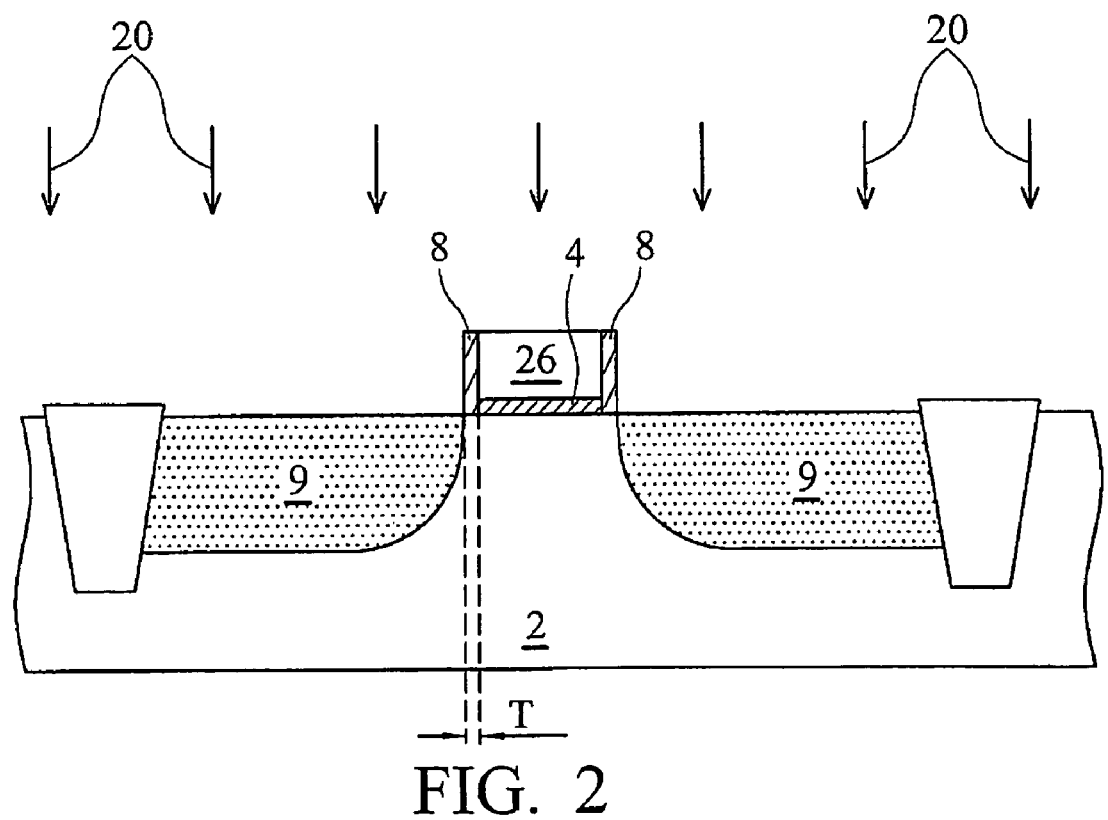
FIGS. 2 through 4 are cross-sectional views of intermediate stages in the manufacture of the embodiment shown in FIG. 1, wherein a MOS device has substantially the same gate and Schottky source/drain work functions.
Figure 3:
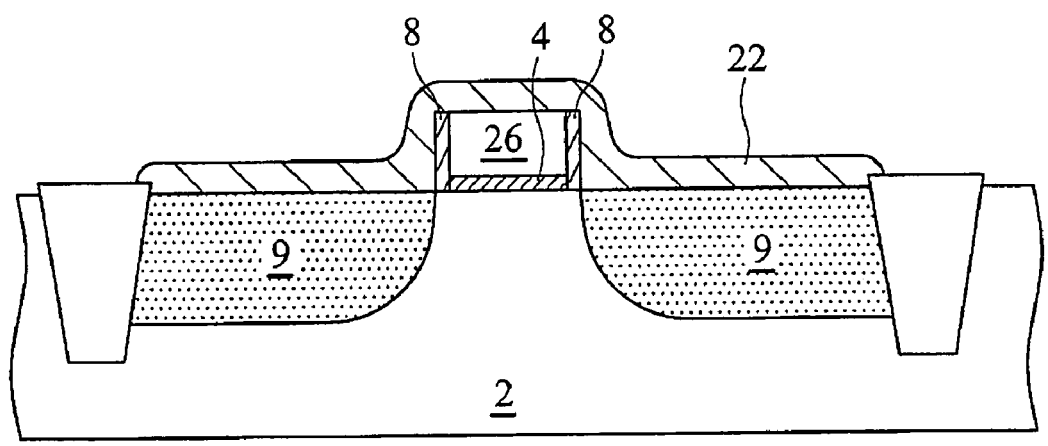
Figure 4:
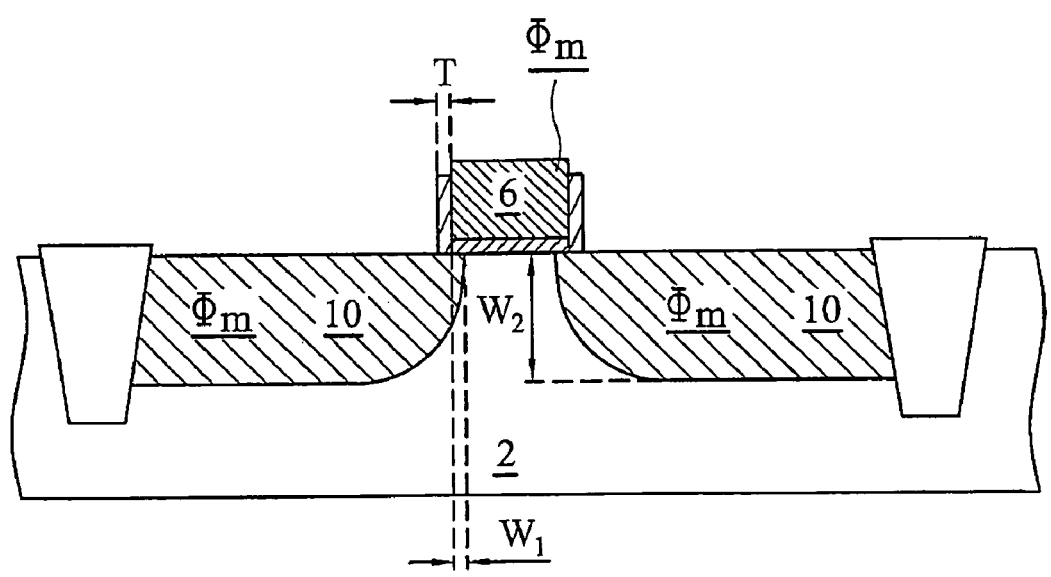

FIGS. 2 through 4 illustrate intermediate stages in the manufacture of the preferred embodiment structure shown in FIG. 1. For simplicity, features discussed in one embodiment may not be repeated in another embodiment. One skilled in the art will realize the applicability of these features to other embodiments. FIG. 2 illustrates a gate dielectric 4, which preferably has a high k value, formed on a substrate 2. A semiconductor (for example, amorphous silicon) dummy gate 26 is then formed on the gate dielectric 4, wherein a dummy gate is a gate consumed in the device manufacturing processes. The dummy gate 26 is formed at a low temperature, preferably lower than about 550° C. Since this temperature is lower than the typical forming temperature, a thinner interfacial layer will be formed between the gate dielectric 4 and the gate electrode 6 or substrate 2. The thickness of the dummy gate 26 is preferably less than about 500 Å so that total gate silicidation can be achieved. Thin spacers 8 are formed along the sidewalls of the dummy gate 26 and preferably have a thickness T of less than about 100 Å.

A dopant implantation, which is symbolized by arrows 20, is optionally performed to the dummy gate 26 and source/drain regions 9. The dopants are selected based on their respective metal-silicide work functions. For example, implanting arsenic typically brings the work function of metal-silicide to around 4.2 eV, while implanting boron typically brings the work function of metal-silicide to around 4.8 eV. Metal-silicide work functions that are either greater than about 4.2 eV or greater than about 4.8 eV are also achievable with higher implant dose (e.g. greater than about 5E20 cm$^{-3}$).

FIG. 3 illustrates a metal layer 22 deposited over the dummy gate 26 and source/drain regions 9. While FIG. 3 illustrates metal layer 22 being selectively deposited, one skilled in the art will recognize the metal layer could alternatively be blanket deposited. Metal layer 22 may comprise a transition metal or metal stacks and has a preferred thickness of between about 50 Å and about 300 Å. Metal layer 22 contributes to the work function of the resulting gate and Schottky source/drain regions. Typically, for nMOS devices, source/drain regions with lower work function are preferred. Therefore, metals having lower work functions such as erbium are preferred. For pMOS devices, source/drain regions with a higher work function are preferred. Therefore, metals having high work functions such as platinum are preferred. Metal layer 22 may also be a metal alloy, such as the alloy of erbium and platinum, with a higher percentage of erbium for nMOS devices and a higher percentage of platinum for pMOS devices. By adjusting the composition of the high work function metals and low work function metals, the alloy may have a desired work function, and the resulting Schottky barrier has a height of less than about 0.3 eV.

FIG. 4 illustrates the silicide formation. A silicidation process, which usually contains at least one annealing step, fully consumes the dummy semiconductor gate 26 and forms silicide gate 6. Schottky source/drain regions 10 are also formed. The annealing is performed at a low temperature, preferably lower than about 550° C. The Schottky source/drain regions 10 preferably slightly exceed the boundary of gate electrode 6, forming overlap regions with a width $W_1$ of greater than about 0 Å, and more preferably greater than about 5 Å. Preferably, the thickness $W_2$ of the Schottky source/drain regions 10 is less than about 300 Å. In this embodiment, with careful selection of the metals 22 and dopants, gate 6 and Schottky source/drain regions 10 will have a work function $\Phi_m$ of less than about 4.3 eV for nMOS devices, and a work function $\Phi_m$ of greater than about 4.9 eV for pMOS devices.

In the previously discussed embodiment, the work functions of the gate electrode and Schottky source/drain region of the MOS device are substantially the same. If different work functions are desired, another method embodiment can be performed as described below.

Figure 5:
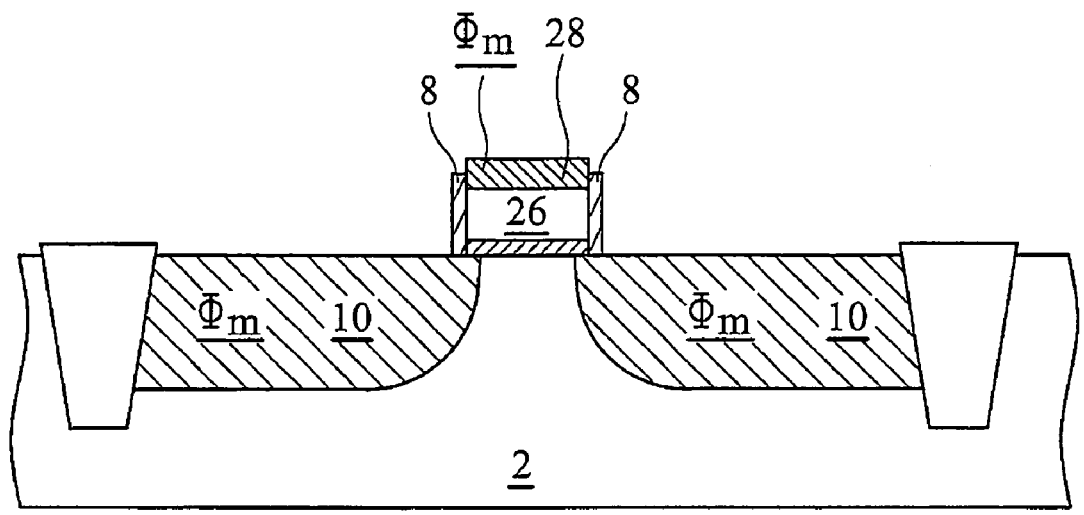
FIGS. 5 through 7 are cross-sectional views of intermediate stages in the manufacture of the embodiment shown in FIG. 1, wherein a MOS device has different gate and Schottky source/drain work functions.
Figure 6:
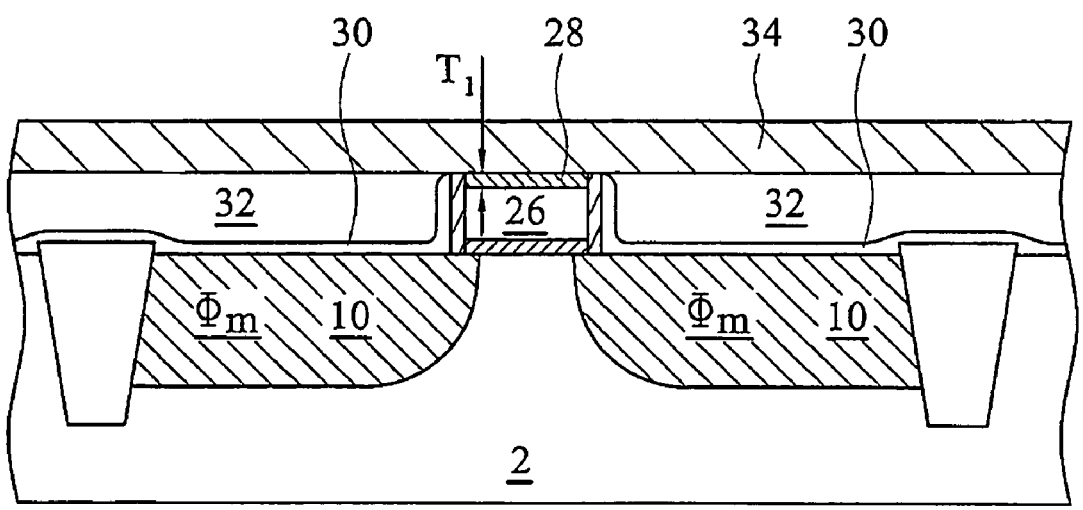

In another preferred embodiment, the initial processes are the same as shown in FIGS. 2 and 3, but gate silicidation is a multi-step process. FIG. 5 illustrates such a structure after the initial silicidation. The dummy gate 26 is not fully silicided and thus a silicided portion 28 at the top, and an un-silicided portion 26 at the bottom are formed. The silicided portion 28 and Schottky source/drain regions 10 have work function $\Phi_m$. FIG. 6 illustrates a contact etch stop layer (CESL) 30 and an inter-layer dielectric (ILD) 32 formed over the previously formed structures. The formation of the CESL 30 and ILD 32 is well known in the art and thus is not repeated. A chemical mechanical polish (CMP) is performed to remove portions of ILD 32, CESL 30 and at least a top portion of the silicided portion 28 until the silicided portion 28 achieves a desired thickness. The metal amount in the remaining portion of the silicided portion 28 partially determines the work function of the subsequently formed gate silicide. Therefore, the preferred thickness $T_1$ relates to how much work function adjustment is desired.

Figure 7:
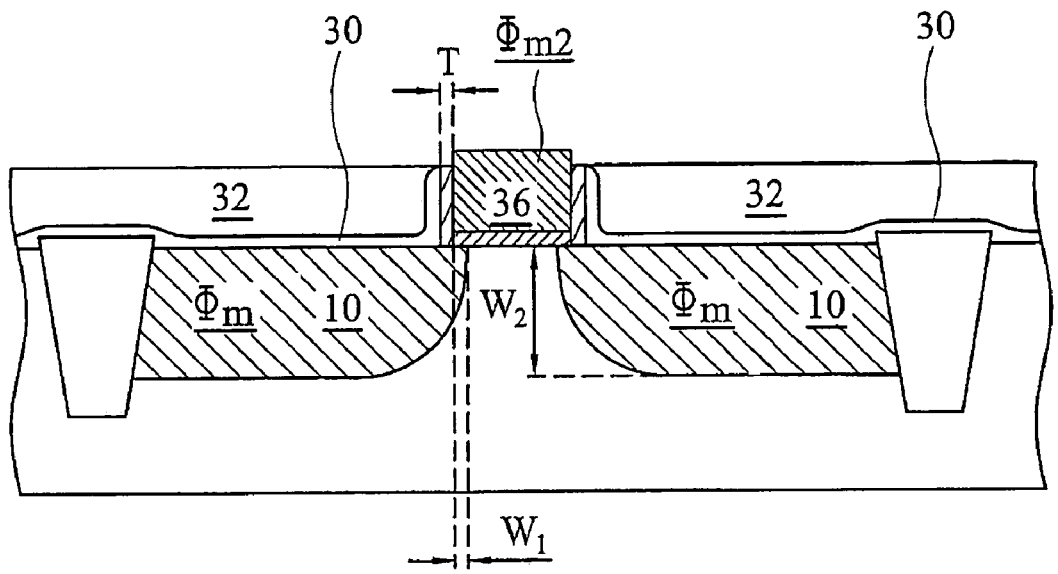

A second metal layer 34 is formed on the previously formed structure. The material of the metal layer 34 is selected based on its work function. FIG. 7 illustrates a second silicidation, which is performed at a low temperature, preferably lower than about 550° C. Metal layer 34 silicides with the remaining silicided portion 28 and un-silicided portion 26 and thus forms a totally silicided gate electrode 36. The work function $\Phi_{m2}$ of the gate electrode 36 is determined by metal layers 22, 34 and their compositions. Since the work function $\Phi_m$ of the Schottky source/drain regions 10 is determined by the material of the metal layer 22, $\Phi_m$ and $\Phi_{m2}$ may be different.

Figure 8:
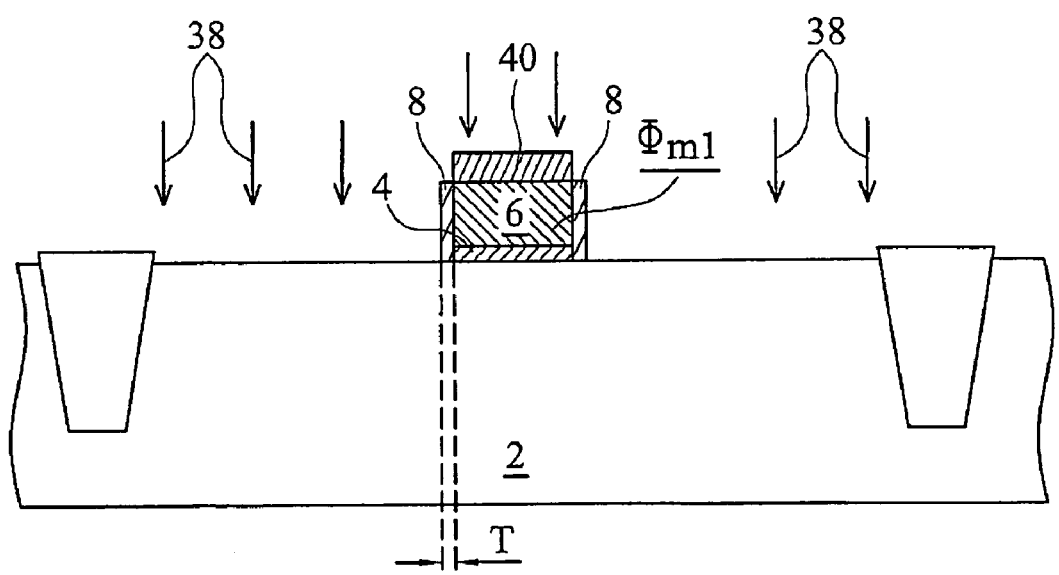
FIGS. 8 through 10 are cross-sectional views of intermediate stages in the manufacture of the embodiment shown in FIG. 1, wherein a MOS device has different gate and Schottky source/drain work functions.
Figure 9:
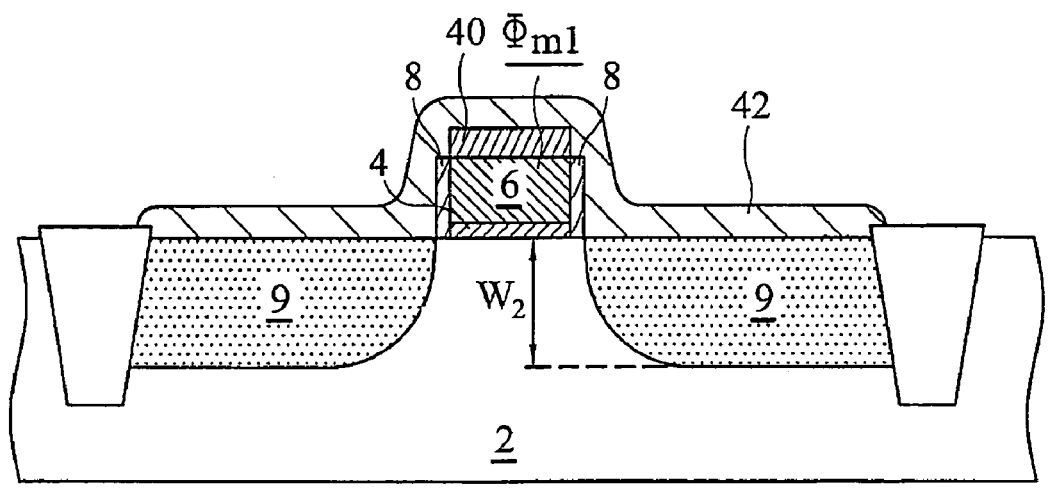
Figure 10:
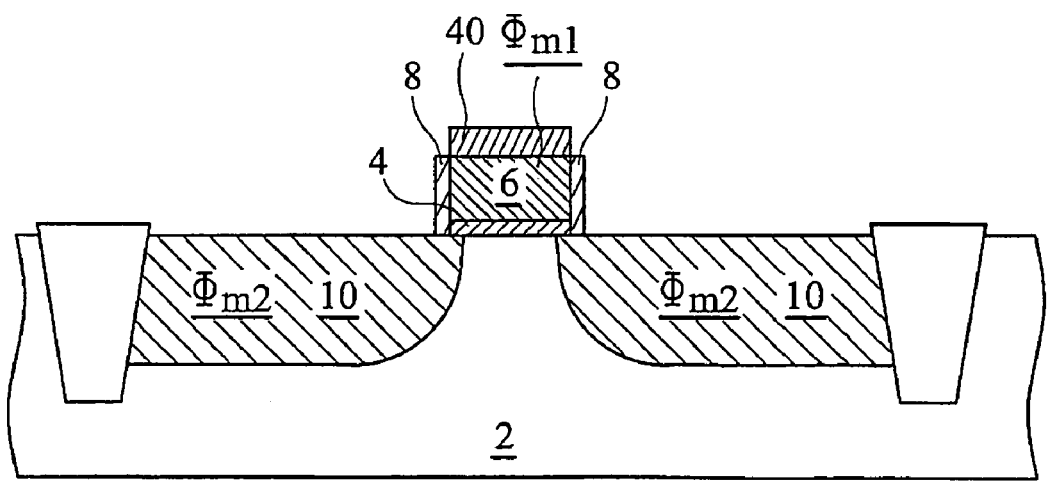

Yet another method embodiment, which forms a device having different respective work functions for the gate and the Schottky source/drain region, is illustrated in FIGS. 8 through 10. FIG. 8 shows a gate structure. In order to form the gate structure, a gate dielectric 4 is formed on a substrate 2. A metal layer 6 is formed on the gate dielectric 4. A dopant, such as, e.g., oxygen, nitrogen or germanium may be optionally implanted into the metal layer 6. This implantation adjusts the work function of the metal layer 6 to a desired value $\Phi_{m1}$. For example, if nitrogen is doped, the work functions for both nMOS and pMOS devices can be increased, while if germanium is doped, the work function for pMOS devices can be decreased. The gate dielectric 4 and metal layer 6 are patterned into a gate stack. Spacers 8 having a preferred thickness T of less than about 100 Å are formed. A protective layer 40 is formed over the gate electrode 6 to prevent subsequent silicidation. The protective layer is preferably a dielectric such as $SiO_2$, $Si_3N_4$, etc.

The substrate 2 is then optionally doped, as symbolized by arrows 38. In the preferred embodiment, n type dopants, such as arsenic, phosphorous, or antimony, are implanted for nMOS devices, and p type dopants, such as boron, $BF_2$, and indium, are implanted for pMOS devices. In other embodiments, p type dopants can be implanted for nMOS devices, and n type dopants can be implanted for pMOS devices. Oxygen can also be added. Implanted regions 9 are formed as a result of the implanting, as shown in FIG. 9.

FIG. 9 illustrates a metal layer 42 deposited and a low temperature silicidation performed to form Schottky source/drain regions 10. A resulting structure is shown in FIG. 10. The temperature of the silicidation is preferably lower than about 550° C., and more preferably at about 450° C. (Inventor, please provide.). The implanted regions 9 are silicided into Schottky source/drain regions 10 with work function $\Phi_{m2}$. Schottky source/drain regions 10 preferably have a thickness of less than about 300 Å. With this embodiment, the gate work function $\Phi_{m1}$ and Schottky source/drain region work function $\Phi_{m2}$ can be separately adjusted.

Figure 15:
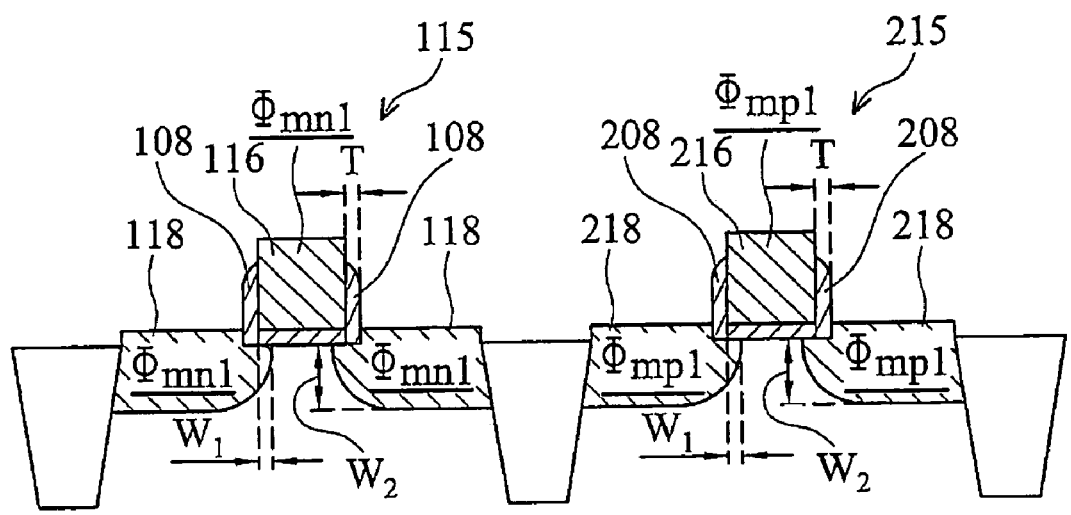

FIG. 15 illustrates a structure with an nMOS device 115 and a pMOS device 215 integrated in one integrated circuit. MOS device 115 is an nMOS device, and its gate 116 and Schottky source/drain regions 118 have respective work functions of less than about 4.3 eV. MOS device 215 is a pMOS device, and its gate 216 and Schottky source/drain regions 218 have respective work functions of greater than about 4.9 eV. Both threshold voltage $V_{th}$ and Schottky barrier are preferably lower than about 0.3V for both the nMOS and pMOS devices. Thin spacers 108 and 208 having preferred thickness T of less than about 100 Å are formed so that the Schottky source/drain region overlaps its respective gate electrode. Each of the nMOS and pMOS devices has the features of the embodiment shown in FIG. 1.

To show how nMOS and pMOS devices having different work functions are integrated in one circuit, various embodiments that form similar structures as shown in FIG. 15 are briefly described in subsequent paragraphs. Certain features, such as the preferred materials dimensions, have been described in the previous discussed embodiments. For simplicity, these features will not be repeated.

Figure 11:
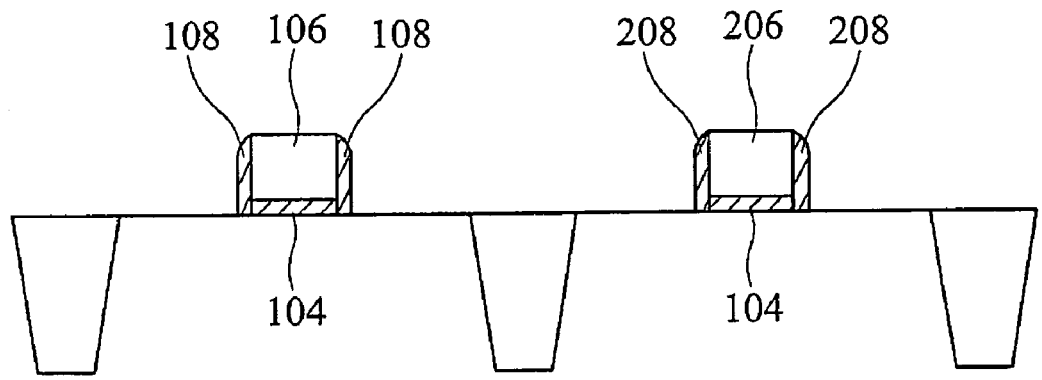
FIGS. 11 through 15 are cross-sectional views of intermediate stages in the manufacture of an embodiment having both nMOS and pMOS devices integrated in one circuit, wherein for each of the MOS devices, the work functions of the gate electrode and the Schottky source/drain regions are substantially the same.

FIGS. 11 through 15 illustrate cross-sectional views of intermediate stages in the manufacture of a preferred embodiment. FIG. 11 illustrates dummy semiconductor gates 106 and 206 formed followed by thin spacers 108 and 208 formation. The thickness of the dummy gates 106 and 206 are preferably less than about 500 Å so that total gate silicidation can be performed. Spacers 108 and 208 preferably have a respective thickness of less than about 100 Å. Gate dielectric 104 preferably has a high K value.

Figure 12:
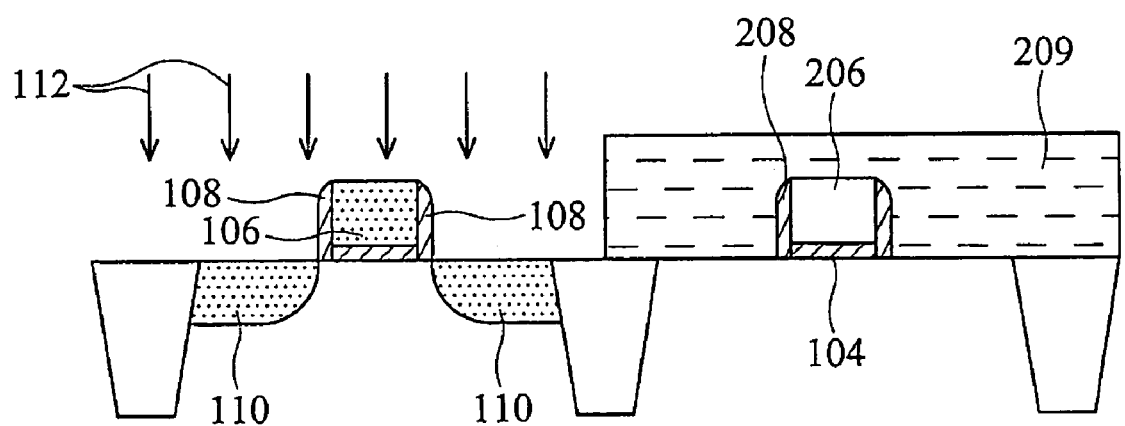
Figure 13:
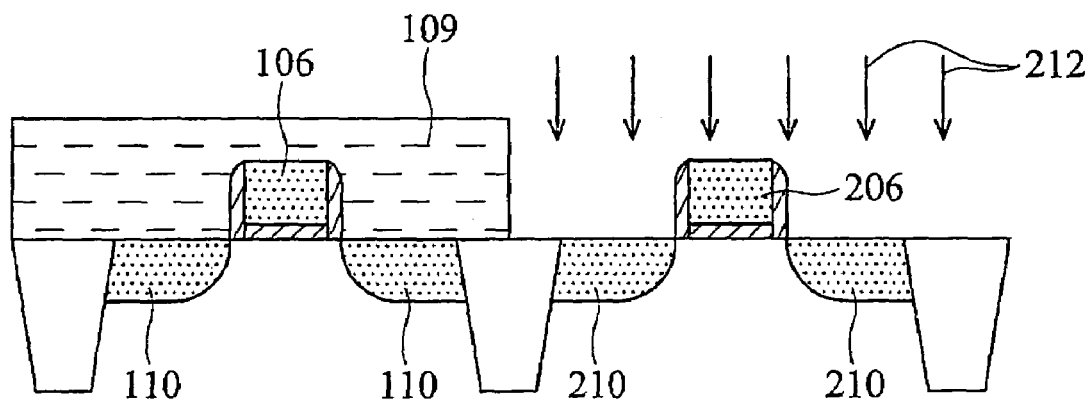

A dopant implantation, which is symbolized by arrows 112, is optionally performed on the nMOS device, forming doped regions 110 as shown in FIG. 12. The pMOS side is masked by a photo resist 209. The dopants are preferably of n type, such as arsenic, phosphorous, and antimony, although other impurities, even of p type, can be used. Optionally, the pMOS device is implanted to form doped regions 210, preferably with p type dopants, such as boron, $BF_2$, indium, etc. Oxygen can be added for both pMOS and nMOS devices. The nMOS side is masked by a photo resist 109, and the implanting is symbolized by arrows 212 in FIG. 13.

Figure 14:
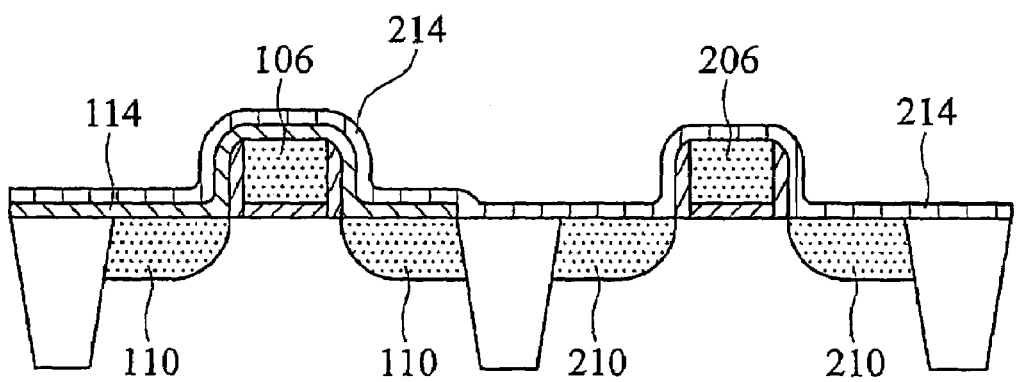

FIG. 14 illustrates the formation of metal layers. With the masking of the nMOS device by a photo resist (not shown) followed by selective metal removal from the pMOS region, a first metal layer 114 is deposited on the nMOS region. A second metal layer 214 is deposited on the pMOS region. It is preferred that the second metal layer 214 is selectively removed from the nMOS region to avoid possible inter-metal diffusion. Alternatively, the pMOS region could be covered with the first metal layer, then the nMOS region could be covered with the second metal layer. A silicidation is then performed. FIG. 15 illustrates the resulting gate silicides 116, 216, and Schottky source/drain regions 118 and 218. The gate electrode 116 and Schottky source/drain regions 118 of the nMOS device have work function $\Phi_{mn1}$, and the gate electrode 216 and Schottky source/drain regions 218 of the pMOS device have work function $\Phi_{mp1}$.

Figure 16:
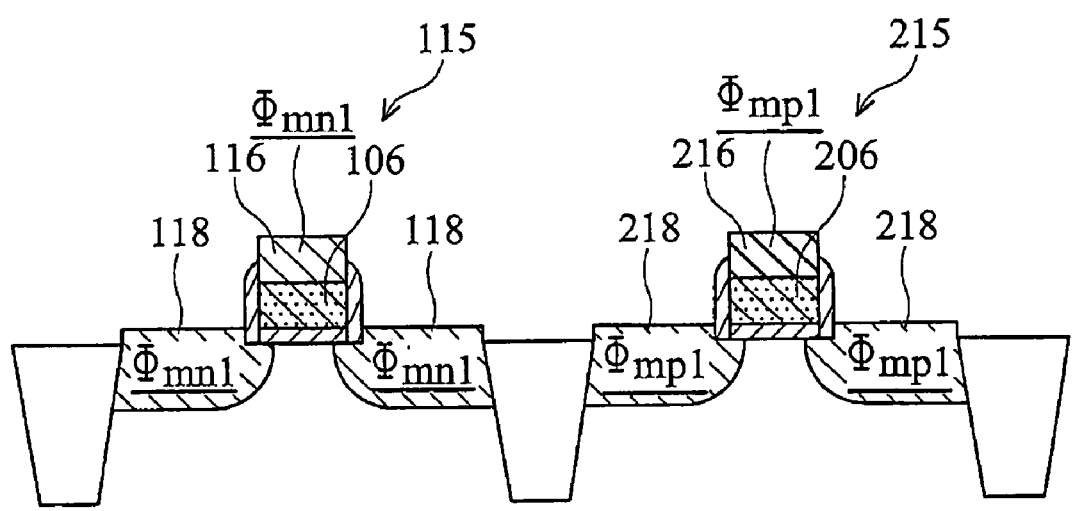
FIGS. 16 through 19 are cross-sectional views of intermediate stages in the manufacture of another embodiment having both nMOS and pMOS integrated in one circuit, wherein for each of the MOS devices, the work functions of the gate electrode and the Schottky source/drain regions may be different.

In the previously discussed embodiment, the work functions of the gate electrode and Schottky source/drain region of each device are the same. If different work functions are desired, a modification can be made to the forming process. In this embodiment, initial processes are the same as shown in FIGS. 11 through 14. However, silicidation only consumes a top portion of the dummy gate 106 and 206. FIG. 16 illustrates such a structure after the silicidation. The device 115 has a silicided portion 116, and a un-silicided portion 106. Similarly, the device 215 has a silicided portion 216 and a un-silicided portion 206.

Figure 17:
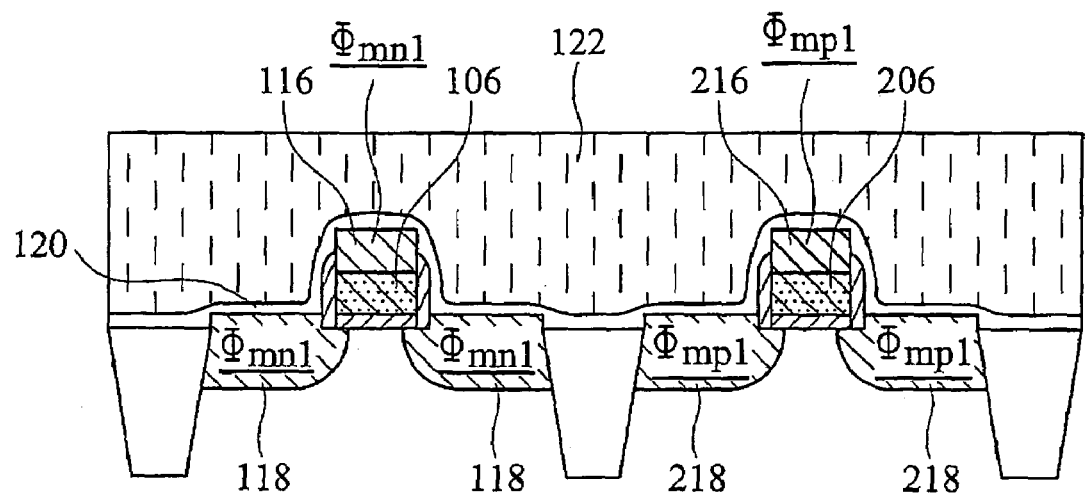

A contact etch stop layer (CESL) 120 and an inter-layer dielectric (ILD) 122 are formed over the entire structure, as shown in FIG. 17. A CMP is performed to remove portions of ILD 122, CESL 120 and at least top portions of the silicided portions 116 and 216 respectively, until desired thickness of the silicided portions is achieved.

Figure 18:
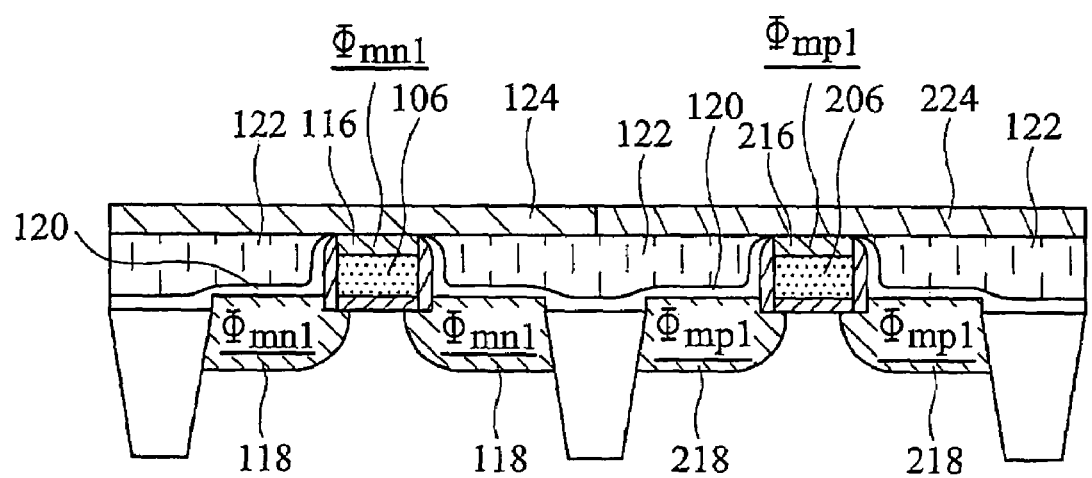
Figure 19:
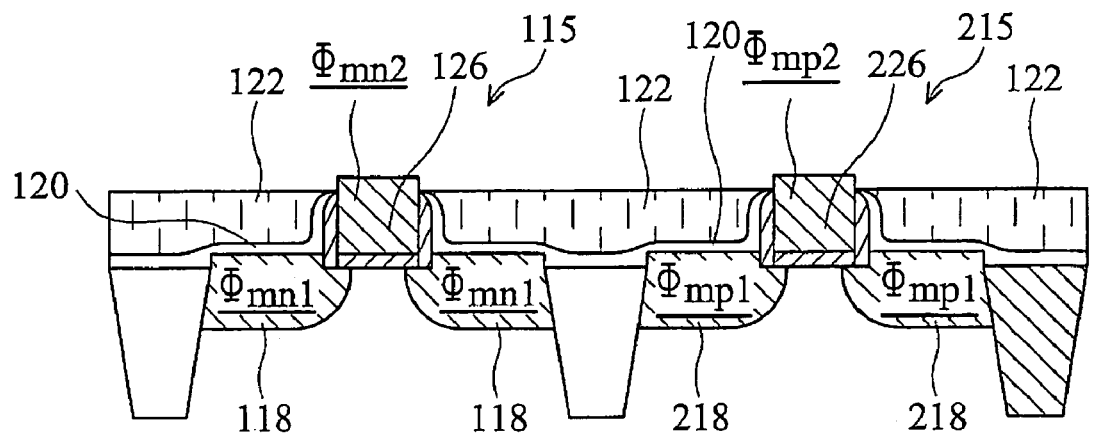

In order to adjust the work functions of the gates of nMOS and pMOS devices separately, a third metal layer 124 is formed over the nMOS device 115, and a fourth metal layer 224 is formed over the pMOS device 215, as shown in FIG. 18. One skilled in the art will recognize the need to mask the nMOS region and the pMOS region, respectively, during formation of metal layer 124 and 224, respectively. FIG. 19 illustrates a structure after a second silicidation process that fully consumes the remaining portions 106 and 206 of the dummy semiconductor gates and forms totally silicided gates 126 and 226. The silicidation is performed at a low temperature, preferably at lower than about 550° C. In the final structure, for the nMOS device 115, the work function $\Phi_{mn2}$ of the gate silicide 126 and the work function $\Phi_{mn1}$ of the Schottky source/drain regions 118 are lower than about 4.3 eV. For the pMOS device 215, the work function $\Phi_{mp2}$ of the gate silicide 226 and the work function $\Phi_{mp1}$ of the Schottky source/drain regions 218 are greater than about 4.9 eV.

Figure 20:
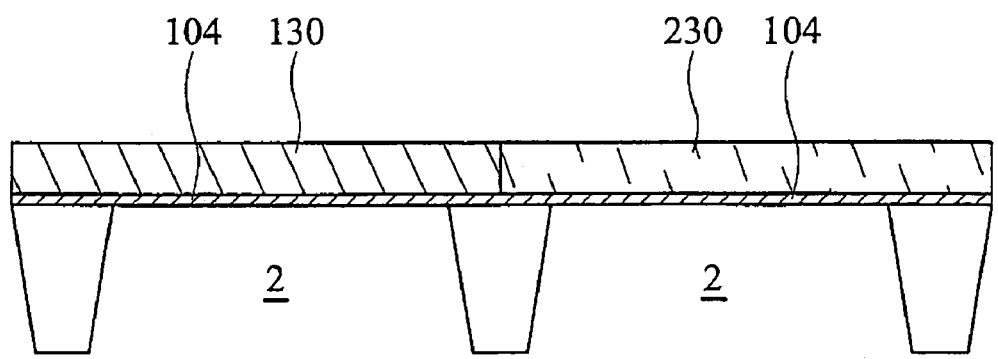
FIGS. 20 through 26 are cross-sectional views of intermediate stages in the manufacture of an embodiment having both nMOS and pMOS devices integrated in one circuit, wherein for each of the MOS devices, the work functions of the gate electrode and the Schottky source/drain regions may be different.

FIGS. 20 through 26 illustrate yet another preferred embodiment of the present invention. FIG. 20 illustrates a gate dielectric 104 formed on a substrate 2. In a region where an nMOS device is to be formed, a first metal layer 130, preferably comprising erbium, is formed. A second metal layer 230, preferably comprising platinum, is formed in a region where a pMOS device is to be formed.

Figure 21:
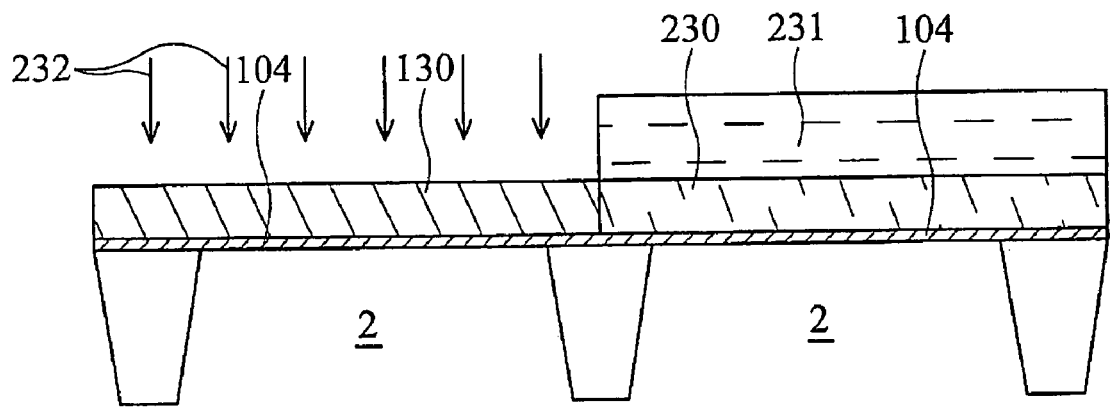
Figure 22:
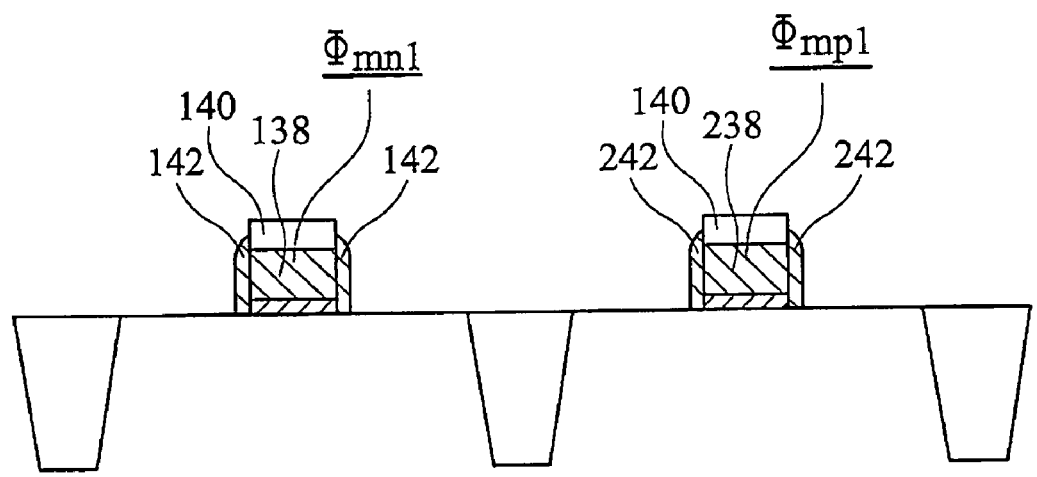

FIG. 21 illustrates an optional step to implant a dopant. While metal layer 230 is masked, as shown at 231, a dopant is implanted into metal layer 130 (symbolized by arrows 232). Another optional implantation (not shown) may be performed to metal layer 230 while metal layer 130 is masked. FIG. 22 illustrates the dielectric layer 104 and its overlying metal layers 130 and 230 being patterned to form gate stacks, wherein gate electrode 138 has a work function of $\Phi_{mn1}$, and gate electrode 238 has a work function of $\Phi_{mp1}$. Spacers 142 and 242 are then formed with preferred thickness of less than about 100 Å. A protective layer 140 is formed on the gate electrodes 138 and 238 to prevent subsequent silicidation.

Figure 23:
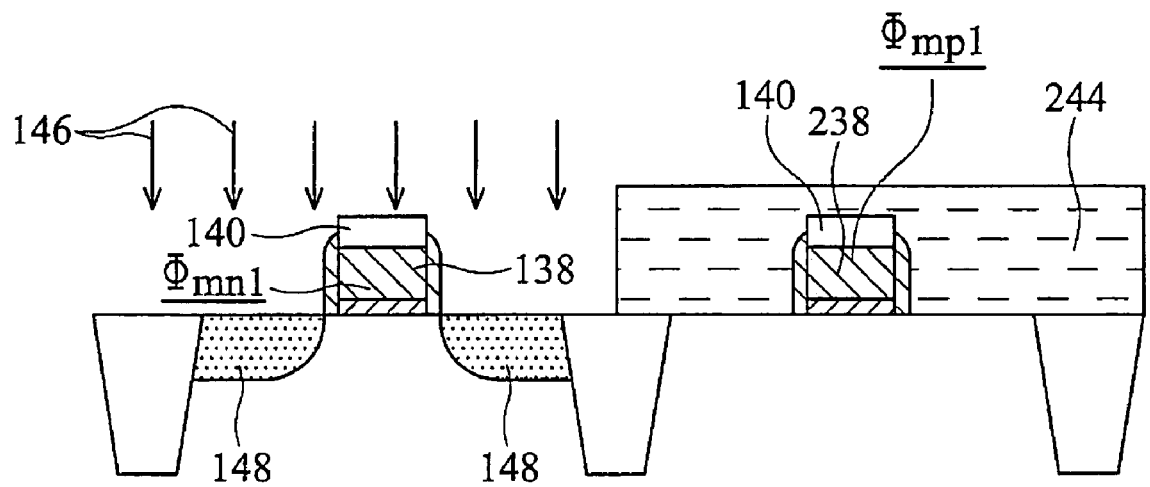
Figure 24:
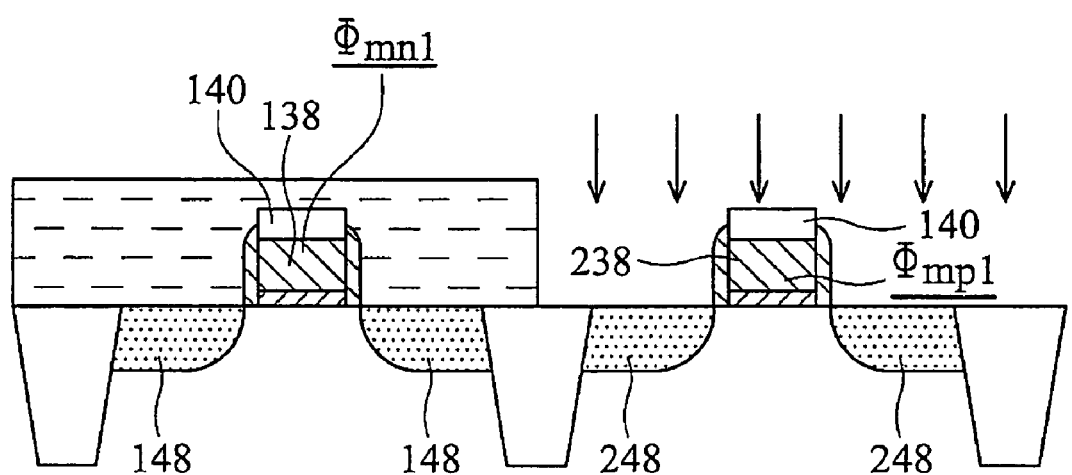

FIG. 23 illustrates the doping of the source/drain regions 148 of the nMOS device. A photo resist 244 protects the pMOS device region. N type dopants, such as arsenic, phosphorous, and antimony, (as well as oxygen) are preferably implanted (symbolized by arrows 146), forming doped regions 148. The protective layer 140 protects the gate electrode 138 from being implanted. Similarly, FIG. 24 illustrates the doping of the source/drain regions 248 of the pMOS device. P type dopants, such as boron, $BF_2$, and indium (as well as oxygen) are preferably implanted, forming doped regions 248.

Figure 25:
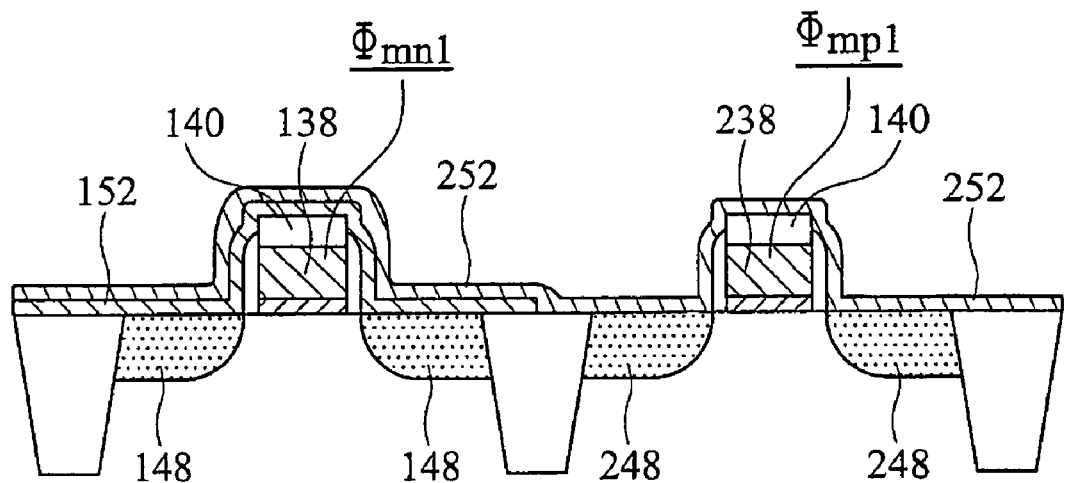

FIG. 25 illustrates the formation of metal layers. With the masking of photo resists (not shown), a first metal layer 152, which provides a lower work function, is formed on the nMOS region. A second metal layer, which provides a higher work function, is deposited on the pMOS region. The second metal layer 252 is preferably removed from the nMOS region to avoid possible inter-metal diffusion.

Figure 26:
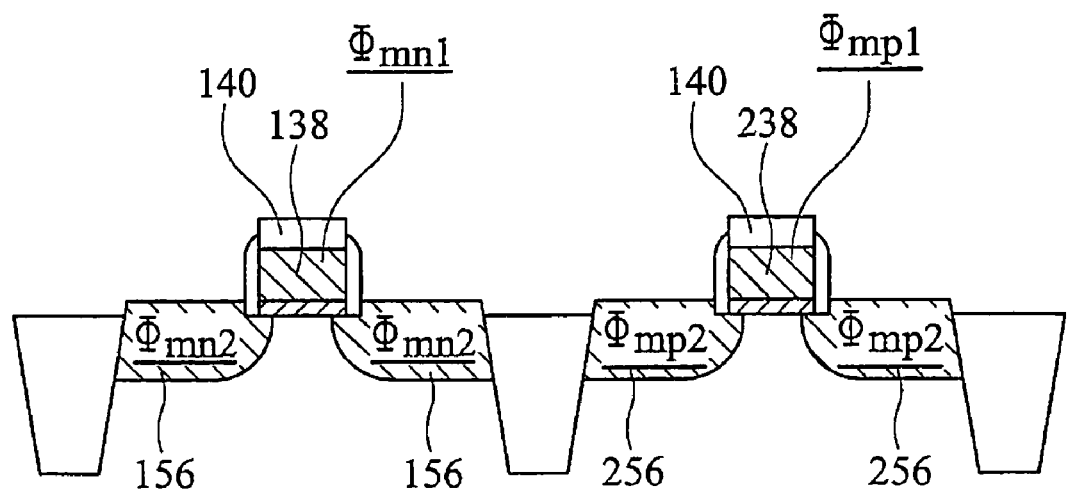

FIG. 26 illustrates a silicidation process performed to form Schottky source/drain regions 156 and 256. The silicidation is preferably performed at a low temperature, preferably at lower than about 550° C. Schottky source/drain regions 156 are formed for the nMOS device with a work function of $\Phi_{mn2}$. Schottky source/drain regions 256 are formed for the pMOS device with a work function of $\Phi_{mp2}$. The protective layer 140 is then removed. With this embodiment of the present invention, the work functions of the gate and Schottky source/drain regions of the pMOS and nMOS devices can be separately adjusted.

It is to be realized that impurities such as nitrogen, germanium, oxygen, boron, $BF_2$, indium, arsenic, phosphorous, antimony and their combinations can be added into different layers and components, such as gate electrode, dummy gate, Schottky source/drain regions, and first, second, and third metal layers as referred to in the previously discussed embodiments. For simplicity, the previously discussed embodiments did not list all applicable materials for each component. However, the effect of the impurities are discussed, and one skilled in the art will be able to select appropriate impurities based on their ability for adjusting work functions.

The preferred embodiments of the present invention have several advantageous features. Firstly, since no dopant-activation anneal for the gate and Schottky source/drain region is required, there is no high temperature process required post gate dielectric formation. Secondly, no deep source/drain and gate implantations are required and therefore the number of lithography steps is reduced. The process is simplified if total gate silicidation and source/drain silicidation are performed at once. Thirdly, the work function of metal-silicided material may be tunable in a wide range by implants and thus the complexity of the process of dual metal materials is eliminated. Low and symmetric threshold voltage and low Schottky barrier height for high drive current can be achieved with dual work functions for the gate as well as for the Schottky source/drain regions. Fourthly, no gate depletion by the metal gate and improved short-channel behavior by the Schottky source/drain regions improve the scalability of gate dielectric thickness and channel length.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising:
   a gate dielectric overlying a semiconductor substrate;
   a gate electrode formed of metal or metal-silicide having a work function of less than about 4.3 eV or greater than about 4.9 eV overlying the gate dielectric;
   a gate spacer on a side of the gate electrode; and
   a Schottky source/drain region having a work function of less than about 4.3 eV or greater than about 4.9 eV in the semiconductor substrate, wherein the Schottky source/drain region overlaps the gate electrode, wherein the gate electrode and the Schottky source/drain region have different work functions.

2. The semiconductor device of claim 1 wherein the Schottky source/drain region is metal silicide.

3. The semiconductor device of claim 1 wherein the Schottky source/drain region has a thickness of less than about 300 Å.

4. The semiconductor device of claim 1 wherein the gate electrode and the Schottky source/drain region have substantially the same work function.

5. The semiconductor device of claim 1 wherein the gate electrode comprises a silicide having an impurity selected from the group consisting essentially of boron, $BF_2$, indium, arsenic, phosphorous, antimony, and combinations thereof.

6. The semiconductor device of claim 1 wherein the gate electrode is doped with an impurity selected from the group consisting essentially of nitrogen, germanium, oxygen, and combinations thereof.

7. The semiconductor device of claim 1 wherein the Schottky source/drain region comprises a silicide doped with an impurity selected from the group consisting essentially of boron, $BF_2$, indium, arsenic, phosphorous, antimony, and combinations thereof.

8. An integrated circuit comprising:
   a pMOS device comprising:
      a first gate dielectric overlying a semiconductor substrate;
      a first gate electrode formed of metal or metal-silicide having a work function of greater than about 4.9 eV overlying the first gate dielectric;
      a first gate spacer having a thickness of less than about 100 Å on a side of the first gate electrode; and
      a first Schottky source/drain region having a work function of greater than about 4.9 eV in the semiconductor substrate, wherein the first Schottky source/drain region overlaps an edge of the first gate electrode; and
   an nMOS device comprising:
      a second gate dielectric overlying the semiconductor substrate;
      a second gate electrode formed of metal or metal-silicide having a work function of less than about 4.3 eV overlying the second gate dielectric;
      a second gate spacer having a thickness of less than about 100 Å on a side of the second gate electrode; and
      a second Schottky source/drain region having a work function of less than about 4.3 eV in the semiconductor substrate, wherein the second Schottky source/drain region overlaps an edge of the second gate electrode.

9. The integrated circuit of claim 8 wherein the first and second Schottky source/drain regions are metal silicides.

10. The integrated circuit of claim 8 wherein the first and second Schottky source/drain regions have thickness of less than about 300 Å.

11. The semiconductor device of claim 8 wherein the first gate electrode and the first Schottky source/drain region have substantially the same work functions, and wherein the second gate electrode and the second Schottky source/drain region have substantially the same work functions.

12. The semiconductor device of claim 8 wherein the first gate electrode and the first Schottky source/drain region have substantially different work functions, and wherein the second gate electrode and the second Schottky source/drain region have substantially different work functions.

13. The semiconductor device of claim 8 wherein the first gate electrode and first Schottky source/drain region comprise suicides having an impurity selected from the group consisting essentially of boron, $BF_2$, indium, and combinations thereof, and wherein the second gate electrode and second Schottky source/drain region comprise silicides having an impurity selected from the group consisting essentially of arsenic, phosphorous, antimony, and combinations thereof.

14. The semiconductor device of claim 8 wherein the first and second gate electrodes are doped with an impurity selected from the group consisting essentially of nitrogen, germanium, oxygen, and combinations thereof.

15. A semiconductor device comprising:
   a gate dielectric overlying a semiconductor substrate;
   a gate electrode formed of metal or metal-silicide having a work function of less than about 4.3 eV or greater than about 4.9 eV overlying the gate dielectric;
   a gate spacer having a thickness of less than about 100 Å on a side of the gate electrode; and
   a Schottky source/drain region having a work function of less than about 4.3 eV or greater than about 4.9 eV in the semiconductor substrate, wherein the Schottky source/drain region overlaps the gate electrode, and wherein at least one of the gate electrode and the source/drain region comprises a suicide having an impurity selected from the group consisting essentially of boron, $BF_2$, indium, arsenic, phosphorous, antimony, and combinations thereof.

* * * * *

UNITED STATES PATENT AND TRADEMARK OFFICE
CERTIFICATE OF CORRECTION

PATENT NO. : 7,176,537 B2 Page 1 of 1
APPLICATION NO. : 11/134897
DATED : February 13, 2007
INVENTOR(S) : Lee et al.

It is certified that error appears in the above-identified patent and that said Letters Patent is hereby corrected as shown below:

Column 10, line 65; delete "suicides" insert --silicides--
Column 12, line 8; delete "suicide" insert --silicide--

Signed and Sealed this

Seventeenth Day of April, 2007

JON W. DUDAS
*Director of the United States Patent and Trademark Office*